United States Patent [19]

Bernardini et al.

[11] 4,345,319

[45] Aug. 17, 1982

[54] SELF-CORRECTING, SOLID-STATE-MASS-MEMORY ORGANIZED BY BITS AND WITH RECONFIGURATION CAPABILITY FOR A STORED PROGRAM CONTROL SYSTEM

[75] Inventors: Vincenzo Bernardini; Enzo Garetti; Renato Manfreddi, all of Turin, Italy

[73] Assignee: CSELT-Centro Studi e Laboratori Telecomunicazioni S.p.A., Turin, Italy

[21] Appl. No.: 51,246

[22] Filed: Jun. 22, 1979

[30] Foreign Application Priority Data

Jun. 28, 1978 [IT] Italy .............................. 68516 A/78

[51] Int. Cl.³ .............................................. G11C 11/40
[52] U.S. Cl. ..................................... 365/210; 365/189
[58] Field of Search ................ 340/173; 365/174, 189, 365/210

[56] References Cited

U.S. PATENT DOCUMENTS

| | | | |
|---|---|---|---|
| 3,763,480 | 10/1973 | Weimer | 365/238 |
| 3,772,658 | 11/1973 | Sarco | 365/238 |
| 3,914,748 | 10/1975 | Barton | 365/238 |
| 4,198,697 | 4/1980 | Kuo et al. | 365/210 |
| 4,247,917 | 1/1981 | Tsang et al. | 365/210 |

*Primary Examiner*—Terrell W. Fears
*Attorney, Agent, or Firm*—Karl F. Ross

[57] ABSTRACT

A mass memory for use with telecommunication equipment comprises a plurality of memory units associated with respective controllers. Each memory unit includes a command module, dialoguing with the associated controller, and a multiplicity of memory modules for the storage of respective information and redundancy bits of a number of data words, one bit of each word being written in an integrated charge-transfer circuit individually assigned thereto and being continuously recirculated when the memory unit is idle. The command module contains a corrective logic which includes a generator of redundancy bits and intervenes during reading and writing phases. An input/output unit, also forming part of the command module, may comprise a switching circuit including a set of multiplexers which may be selectively operated by instructions from the controller to replace a defective memory module by a spare module whose bit-storing circuits already contain the data of the defective module or can receive them in a reinitialization operation. Instead of a single command module, three such modules synchronized with one another can be used to control the reading and writing through majority logic.

5 Claims, 15 Drawing Figures

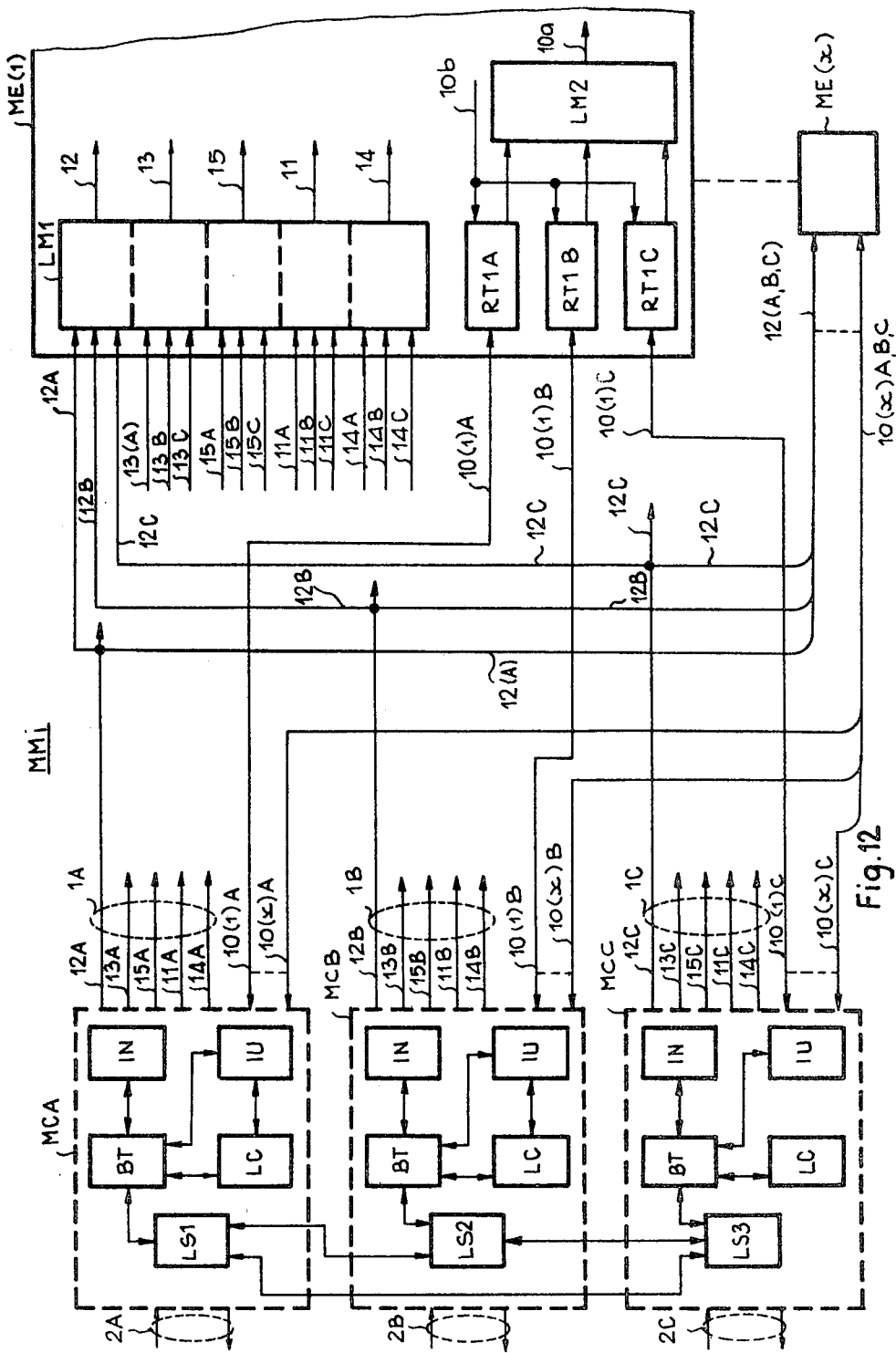

SELF-CORRECTING, SOLID-STATE-MASS-MEMORY ORGANIZED BY BITS AND WITH RECONFIGURATION CAPABILITY FOR A STORED PROGRAM CONTROL SYSTEM

FIELD OF THE INVENTION

The present invention relates to stored-program control systems for telecommunication equipment and more particularly to a self-correcting mass memory with reconfiguration capability, making use of the charge-coupled-device (CCD) technology.

BACKGROUND OF THE INVENTION

It is known that present stored-program control systems have memories organized in a hierarchic structure, including fast-access memories for on-line programs and data (main memories) followed by other memories, generally with slower access, for programs and data of less immediate and frequent use (mass memories). The latter memories often act also as auxiliary stores for the main memories, that is they contain also semi-permanent data and on-line programs necessary to allow the control system to resume its normal operation when a failure occurs in the main memories.

Till now, mass memories consisted usually of disk units, magnetic tapes or drums because, owing to the state of the art, these devices alone combined large storage capacity with low cost.

However, magnetic memories present some inconveniences, namely:

they cannot attain sufficiently high operating speed, chiefly fast access time;

they cannot ensure a sufficiently high "system availability" (meaning probability of finding the system operating at any moment), owing to the frequent interventions necessary to maintain the efficiency of the units; this is due to the fact that the magnetic units have moving mechanical parts that require an initial running-in and present wear phenomena that can also require preventive maintanance.

For these reasons, studies aimed at obtaining memories of different types mainly for small and medium capacity (for instance up to 10 million words) have become very important; owing to the development of techniques used to build solid-state components, these studies have been directed toward highly integrated components and more particularly toward charge-coupled devices.

A memory of this type with operating characteristics very similar to those of a disk unit is already commercially available.

Such a solid-state memory intrinsically has high operating speed as well as good reliability and easy-maintenance characteristics; moreover, it exhibits good modularity enabling an initial use of rather small units that can thereafter be supplemented according to requirements.

Still, this memory presents certain drawbacks that limit its utility in telecommunication-system control; thus, it has no facility for automatic error correction and is organized by "bytes", that is by 8-bit words.

Since in telecommunication applications the control system must be in service continuously, it is important for the mass memory to be provided with self-correcting means preventing the system from becoming disabled during the time necessary for detecting the cause of the error and remedying same; self-correction provides an efficient protection of the stored data so that they do not get lost and can be used by a possible auxiliary unit put into service by a reconfiguration system.

In fact, processing systems with severe reliability requirements need usually a plurality of mass-memory units. On the other hand, if redundant parts for replacing any malfunctioning unit are provided within one of those memory units, the reliability requirements of the processing system could be met by a single mass-memory unit, affording significant savings.

Moreover, for both speed and flexibility purposes in the telecommunication field and in processing generally, the control system must operate on words of 16 bits or more.

To achieve flexibility on the actual length of the words, on the number of redundancy bits necessary for self-correction and on the number of spare parts, a memory should be organized by bits and should include many modules each storing one bit of a plurality of words.

OBJECT OF THE INVENTION

Thus, the object of our present invention is to provide a solid-state mass memory organized by bits, using solid-state components of the type referred to above, which can be utilized in a control system for telecommunication equipment requiring high reliability and which comprises both automatic error-correction means and internal redundancies allowing its reconfiguration.

SUMMARY OF THE INVENTION

The improved mass memory according to our invention comprises a first group of solid-state memory modules for the storage of a multiplicity of information words and a second group of such memory modules for the storage of as many redundancy words respectively associated therewith, the number of modules of the first group equaling the number of bits in each information word while the number of modules of the second group equals the number of bits in each redundancy word. Each memory module includes a multiplicity of integrated charge-transfer circuits for the continous recirculation of respective bits, each charge-transfer circuit consisting of several randomly accessible blocks of series-parallel-series registers responsive to shift and transfer signals as is well known per se.

The mass memory further comprises a command module which is responsive to signals from the controller for writing and reading respective bits of an information word and of an associated redundancy word at corresponding locations of selected charge-transfer circuits of all memory modules of both groups, the command module including a time base for the emission of the aforementioned shift and transfer signals as well as an address generator identifying the reading and writing locations along with corrective logical circuitry communicating with the memory modules through an input/output unit for verifying the accuracy of bits written and read in accordance with conventional error-detecting methods.

According to a more particular feature of our invention, the mass memory further includes at least one spare module designed to take the place of a defective memory module of either group. The input/output unit of the command module then comprises switching means responsive to an instruction from the controller for loading the spare module with the contents of the defective memory module unless both modules already contain the same data. Such an identity of contents may be achieved with the aid of a multiplexer forming part of the aforementioned switching means, this multiplexer having an output connected to the spare module and inputs connected to lines which serve for the transmission of bits from the command modules to respective memory modules of the two groups. With the multiplexer normally connecting one of its inputs to its output, bits traveling over the line joined to this particular input are concurrently fed to the corresponding memory module and to the spare module.

BRIEF DESCRIPTION OF THE DRAWING

The above and other features of our present invention will now be described in detail with reference to the accompanying drawing in which:

FIG. 12 shows schematically an embodiment of a memory unit with full redundancy according to our invention.

SPECIFIC DESCRIPTION

Figure 1:
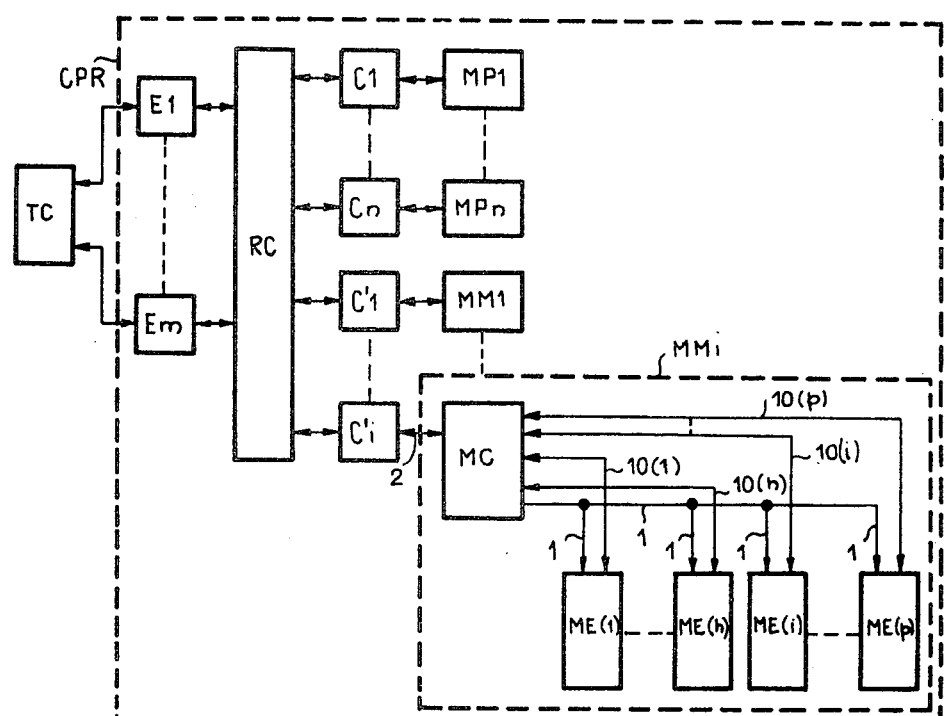
FIG. 1 represents the block diagram of a solid-state mass-memory unit and its interconnections with a multiprocessor-type processing system.

FIG. 1 shows telecommunication equipment TC, for instance a telephone exchange, with a stored-program control system CPR that by way of example and for the sake of generality is supposed to be of the multiprocessor type.

System CPR comprises a plurality of processing units E1 . . . Em, several main memory units MP1 . . . MPn for on-line data and programs, and several mass-memory units MM1 . . . MMi.

The number of memory units MM is determined by both storage capacity and reliability requirements, the latter especially if individual units are not internally provided with redundant structure.

Processing units E are connected to the various memory units through a coupling network RC and respective control units C1 . . . Cn, C'1 . . . C'i, i.e. devices controlling data transfer between processing and memory units. Such control units are well known in the art and will therefore not be described in detail.

Every mass-memory unit MM1 . . . MMi is composed of a plurality of memory modules ME(1) . . . ME(p) as well as of a command module MC.

Memory modules ME are formed by integrated circuits using charge-coupled technology; according to the present invention each module stores one bit of all the words storable in the module.

These words are composed of information bits, stored in modules ME(1) . . . ME(h), and redundancy bits, stored in modules ME(i) . . . ME(p) that can be used for error detection and correction.

The number of modules ME of a unit MM is thus equal to the number of bits of a word.

In telecommunication systems, for reasons of operating speed, the words ought to contain at least 16 information bits; with a system using the Hamming code for error correction, the minimum number of redundancy bits ensuring correction of a single error on 16 bits is 5 bits.

As each module stores one bit of each of a plurality of words, the Hamming code allows the detection and correction of all the possible errors occurring in a memory module, as described hereinafter.

The embodiment of FIGS. 1 to 7 applies to words containing, besides the information bits, only the minimum number of redundancy bits, assuring the correction of single errors; in particular, it relates to 16-bit information and 5-bit redundancy words.

Thus, each memory unit is composed of 21 modules. Nevertheless, a characteristic of the invention is its horizontal flexibility; hereinafter, we shall describe a mass memory with a higher number of redundancy bits allowing the detection of multiple errors or, above all, the internal reconfiguration of the memory unit by using one or more modules devoted to redundancy bits: "reconfiguration" means the possibility of replacing a faulty memory module with a spare module.

The memory modules are connected to one another and to the command module through a bus 1 conveying to all the modules both addresses and control signals; furthermore, each memory module is connected bidirectionally to the command module through a wire 10(1) . . . 10(p) carrying its information bits.

The structure of modules ME will be described in greater detail with reference to FIG. 2.

Command module MC, which is connected to the associated controller C' through a bus 2, has the tasks of controlling the exchange of data between the control and memory units, of generating the timing signals necessary to the operation of the memory unit, of providing the correct addresses during the operations, and of supervising the operation of the memory itself by detecting and correcting errors.

The data transfer between command module MC and the associated controller C' is parallel/asynchronous, i.e. all the bits of a word are transferred in parallel to the command module at the required instant.

The independent control of addressing and timing allows the simplification of the structure and programming of the controller; besides, by a suitable choice of the controller, the mass memory may be seen by the computing system as any main-memory bank. The structure of unit MC will become clearer from FIG. 3 described below.

Figure 2:
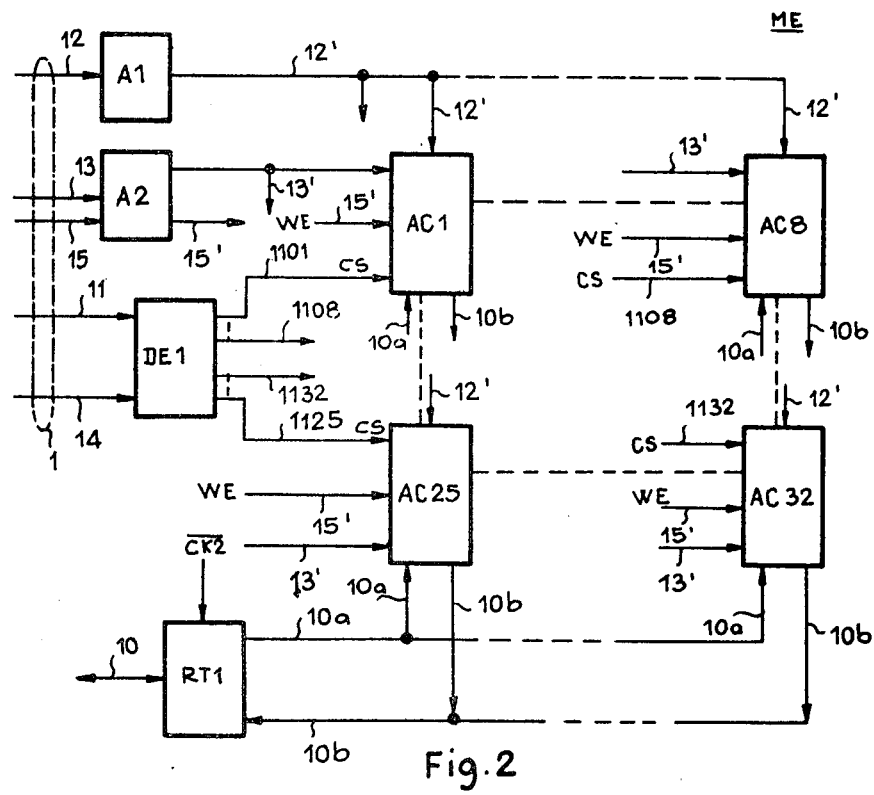
FIG. 2 is a block diagram of a memory module of the memory unit of FIG. 1.

As illustrated in FIG. 2, a generic memory module ME comprises a plurality of integrated charge-coupled circuits AC, identical to one another and designed to store a bit of each word to be loaded into the corresponding memory unit MM. The choice of the integrated circuit and the number of circuits AC of a module will depend on the required capacity of each module; obviously that number will also depend on construction standards.

By way of example, a module with 32 integrated circuits AC1 . . . AC32 is shown.

Advantageously, each integrated circuit AC consists of a plurality of individually addressed blocks of shift registers organized in serial-parallel-serial configuration, that is each block contains an input register loaded in series and unloaded in parallel, a plurality of intermediate registers loaded and unloaded in parallel, and an output register loaded in parallel and unloaded in series. By this arrangement the registers of a block actually behave as a single register, and all the blocks form together a random-access memory.

In these circuits, beginning from a position indicated by the controller, read, write or "read-modify-write" operations may be effectuated. The last-mentioned operation occurs when correcting devices have detected an error to be rectified. In the absence of requests for operation, the information will be "refreshed" by recirculating the bits of the information itself.

Inside each block, fast timing signals control the shifting in series within a register (more particularly the loading of the input register and the unloading of the output register); slow timing signals control the transfer in parallel between adjacent registers (more particularly, the unloading of the input register and the loading of the output register).

According to the present invention these signals, hereinafter referred to as "shift signals" and "transfer signals", respectively, have different periods and/or shapes depending on the type of operation effectuated and on the working phase within each operation, as will be more fully described hereinafter. In all operational phases the ratio between the periods of the two types of signals will obviously remain constant.

A charge-transfer circuit of this type is sold under the name of CCD 464 by the Fairchild Camera and Instrument Corporation of Mountain View, Calif.; this circuit comprises 16 blocks of 128 registers with 32 positions, in which the shifting is controlled by a pair of signals $\Phi_1$, $\Phi_2$ (see FIG. 4) the first of which determines the time allotted to each bit and the second of which controls the actual loading or unloading in series. A second pair of signals $\Phi_3$, $\Phi_4$, having a period 32 times as long, controls the transfer in parallel.

For the sake of clarity, the following description will be made with the assumption that bit-storing circuits AC correspond to the aforedescribed circuit CCD 464. Yet, by means of obvious modifications, the invention can be applied to any type of charge-coupled memory circuit organized by blocks of registers available in serial-parallel-serial configuration.

References A1, A2 denote conventional buffers receiving from the command module, through wires 12, the address bits relating to one of the 16 register blocks in all circuits AC and, through wires 13, the shift and transfer signals; buffers A1, A2 amplify these signals so that they can drive all circuits AC.

Buffers A1, A2 are connected to circuits AC through connections 12' and 13', corresponding to their respective inputs 12, 13. One buffer, for example amplifier A2, receives from the command module, through a wire 15, also a "write enable" signal WE, conveyed to circuits AC through a wire 15'.

Reference DE1 denotes a conventional decoder receiving from the command module, through a connection 11, the most-significant address bits (i.e. the bits identifying one of the 32 circuits AC); the output of decoder DE1 is a signal CS enabling the actual addressing of one of circuits AC1 . . . AC32.

Signal CS is sent to the relevant circuit through one of several wires 1101 . . . 1132.

The decoder receives also from the command module, through a wire 14, an overall enabling signal.

Reference RT1 denotes a transceiver acting as a data input/output unit, connected to the command module through a wire 10 and to memory circuits AC through wires 10a, 10b conveying the bit to be written and the read bit, respectively.

The operation of the transmitter of circuit RT1 is enabled by a signal coming from the command module (signal $\overline{CK2}$), as described hereinafter.

Figure 3:
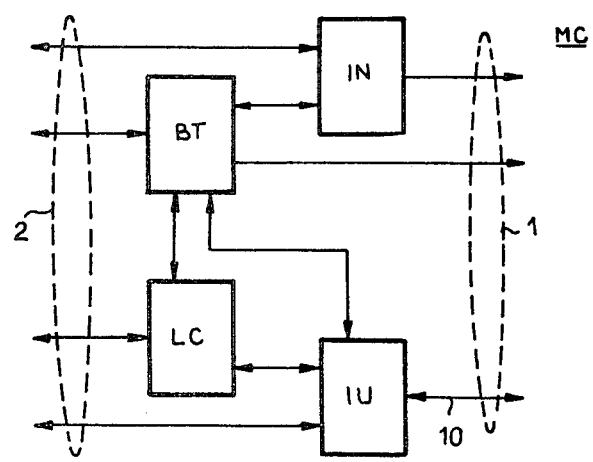
FIG. 3 is a block diagram of a command module for the memory unit of FIG. 1.

As illustrated in FIG. 3, command module MC comprises a time base BT, an address-control device IN, a data input and output unit IU and a self-correcting logic LC.

The microprogrammed time base BT is designed to generate timing signals for the corresponding memory unit MM (FIG. 1), including the aforementioned shift and transfer signals, and to generate together with device IN read and write addresses in circuits AC (FIG. 2) of each module ME (FIG. 1). The microprogrammed structure operates so that certain operations occur at a variable speed depending on the operating phases, this being an important feature of our invention.

Input/output unit IU has the task of controlling the operations connected with the asynchronous data exchange between the controller and the memory unit.

Self-correcting logic LC is designed to generate reduncancy bits, on the basis of the information bits received through unit IU; in case of memory reading, logic LC is also able to compare the generated bits with the read bits and, in case of any discrepancy, to correct the information bits and to signal the discrepancy to the controller.

The structure of blocks IN, BI, IU, LC and the connections between these blocks are illustrated in greater detail with reference to the following Figures. To simplify the drawing, FIG. 3 schematizes by separated connections the links of each block with the controller, with the memory modules and with the remaining blocks.

Figure 4:
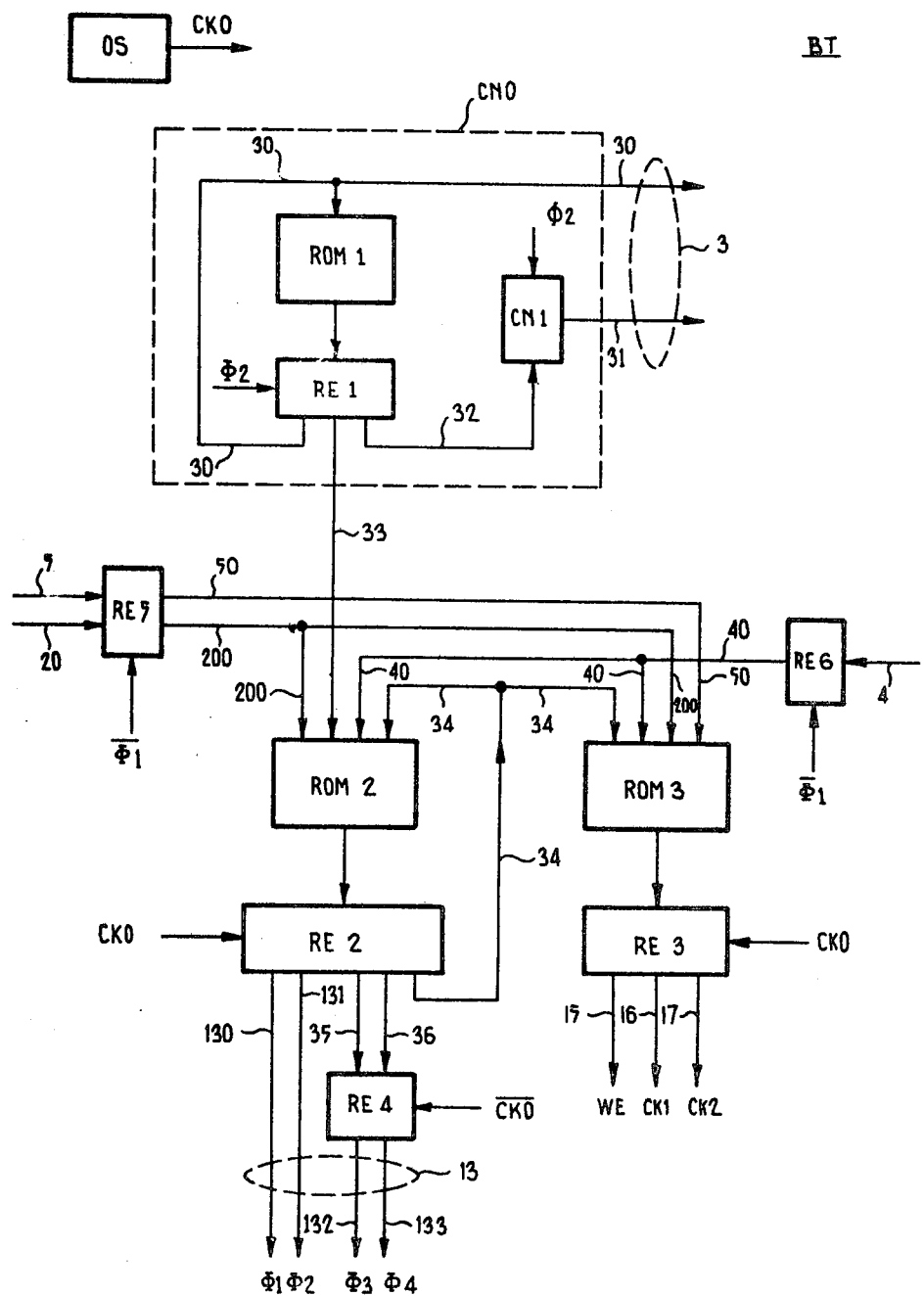
FIG. 4 is a detailed diagram of a time base for the command module of FIG. 3.

In FIG. 4, time base BT is shown to comprise a conventional oscillator OS which generates a fundamental clock signal CKO utilized by the time base to produce other timing signals.

References ROM1, RE1, CN1 denote a read-only memory, a parallel-parallel register and a counter that together form a 4096-step address counter CNO. More particularly, the count of circuit CNO identifies the position of a word inside a block of registers in circuits AC (FIG. 2) of the different modules as a result of the shift and transfer signals; at the output 31 of counter CNO the least-significant bits of the complete address will be present.

Counter CNO is subdivided into two cascaded 64-step counters one of which, with output decoding, consists of components ROM1 and RE1 while the other is component CN1.

Memory ROM1, which is addressed by the counting of its internal state, contains 64 words, each comprising six bits of internal state (indicating its 64-step count), three bits forming a conditioning signal for a second read-only memory ROM2, and one bit forming the carry of the counter.

The words of memory ROM1 are stored and discharged in parallel by register RE1 upon command of the shift signal $\Phi_2$; thus, register RE1 stores a new word each time that a bit must be shifted by one position inside the input or output register of a block of circuits AC (FIG. 2).

The output of register RE1 relating to the state bits (wires 30 of a connection 3) is carried to memory ROM1 as an address signal; wires 30, together with wires 31 outgoing from counter CN1, transfer to device IN (FIG. 3) the sequential part of the address, to be compared with the same address part generated in device IN.

The output 32 (FIG. 4), relating to the carry, forms an input of counter CN1 and advances it by a step with each complete reading of memory ROM1.

The count of component CN1, which originates the most-significant bits of the sequential part of the address, is present on output 31 upon a command of the same signal $\Phi_2$ that controls the loading of bits into register RE1. In this way all the bits of the sequential part of the address are present at the same time.

A further output 33 of register RE1 transfers to memory ROM2 three decoding bits of the internal state of memory ROM1, used for generating transfer signals.

Memory ROM2 forms with a second parallel-parallel register RE2 a sequential logic with 8 internal states identifying the elementary time inside a cycle, designed to generate shift and transfer signals $\Phi_1$–$\Phi_4$. Memory ROM2 contains 512 words, each comprising three status bits and four bits relating to signals $\Phi_1$–$\Phi_4$, and is jointly addressed by its internal state, the decoding bits of the internal state of memory ROM1, two bits denoting what type of operation is in progress, and the result of the comparison between the sequential part of the address generated by counter CNO and the one generated by device IN (FIG. 3).

The signals denoting the type of operation arrive from the controller through wires 20, a register RE5 and wires 200; the comparison signal arrives from device IN through a wire 4, a register RE6 and a wire 40.

Registers RE5, RE6 can emit the signals present at their inputs in response to the trailing edge $\overline{\Phi}_1$ of a pulse $\Phi_1$.

The words of memory ROM2 are stored and discharged by register RE2 at a rhythm similar to that of fundamental clock CKO. The outputs of register RE2 relating to the internal state of memory ROM2 (wires 34) are used as addressing signals for the memory itself and for a further read-only memory ROM3; the outputs relating to shift signals $\Phi_1$, $\Phi_2$ (wires 130, 131) are sent to memory circuits AC; the transfer signals $\Phi_3$, $\Phi_4$ present on output wires 35, 36 are stored in a register RE4 designed to establish the proper phase position of these transfer signals with respect to the shift signals. The storage in register RE4 is controlled by the trailing edges of the pulses CKO (signal CKO) whereas register RE2 is controlled by the leading edges of the same pulses.

The actual transfer signals $\Phi_3$, $\Phi_4$ are present on output wires 132, 133 of register RE4 which with wires 130, 131 form connection 13.

The use of read-only memories allows the required variability of both period and shape of these signals to be easily obtained in accordance with the type and the current phase of each operation.

More particularly, at each read and/or write operation, a fast shift of bits in the register blocks can be carried out until the required initial word is reached; after this phase a slower shift will occur (for instance with a double period) for the actual transfer of words to the memory or to the processor. In this way a reduced access time is obtained, while the read and/or write modes occur at a slower rhythm in order to take into account the processor requirements.

As to the shape of the shift and transfer signals, the address of memory ROM2 dependent on the kind of operation will of course allow the emission of a sequence of words such that the bits relating to each one of these signals may remain in either of their logic states as long as required. This will become clear from FIGS. 8a–8d discussed hereinafter.

Read-only memory ROM3 is a combinatory logic that, on the basis of the kind of operation (instructions present on wires 200), of the internal state of memory ROM2 (arriving there through wires 34), of the comparison signal coming from device IN (FIG. 3) through wires 4, 40, and of two signals denoting the data-transfer status (signals coming from input/output unit IU, FIG. 3, through wires 5, register RE5 and wires 50), generates timing signals different from shift and transfer signals $\Phi_1$–$\Phi_4$.

Memory ROM3 contains 256 words, each one of them comprising the bit constituting the write-enable signal WE and two bits (CK1, CK2) the first of which enables the data transfer to the controller and the generation of the sequential part of address by means of device IN whereas the second one enables the data transmission to memory modules. In the absence of bit CK2, data transmission to the controller will be enabled by the memory modules. It is worth noting that bit CK1 can be emitted only if the signals present on wires 50 denote the end of an operation and signify that address identity between the outputs of components IN and CNO occurs for this cycle.

It has to be remembered that registers RE5, RE6 load the bits present at their inputs in response to the trailing edge $\overline{\Phi}_1$ of a pulse $\Phi_1$. In this way the memory knows, practically at the beginning of a memory cycle, whether or not it has to effectuate an operation, whether it must set itself in a search phase or whether data must actually be read or written.

A parallel-parallel register RE3 timed by clock pulses CKO provides the correct positioning in time of the signals generated by memory ROM3 before transferring them through wires 15, 16, 17 to the circuits in which they are utilized. The shape of signals WE, CK1, CK2 will also become apparent from FIGS. 8a–8d.

Figure 5:
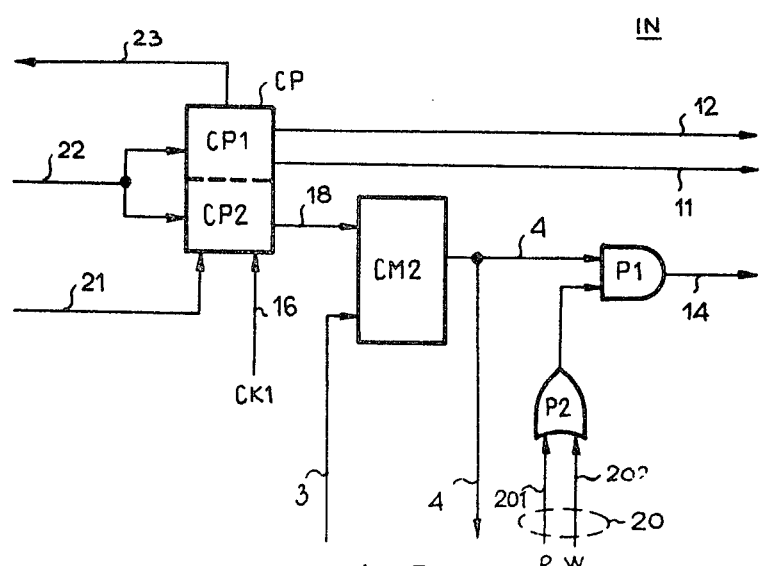
FIG. 5 is a detailed diagram of means for checking the addresses in the command module of FIG. 3.

In FIG. 5, address-control device IN is shown to comprise a presettable counter CP with inputs connected to the controller through a line 22 and a wire 21 carrying the address of the first word involved in an operation and the loading command for such address, respectively. Beginning with such an address, counter CP generates sequentially the addresses of all the words involved in the operation and increases its contents at the end of each read and/or write operation. The advance command is provided by signal CK1 whose generation, as stated, depends on the ending of a preceding operation.

Counter CP can be considered as subdivided into two parts CP1 and CP2 which respectively receive the most-significant bits of an address (that is the bits identifying the integrated circuit in each module involved in an operation and the block of shift registers in that circuit) and the least-significant bits of the same address (that is the bits identifying the word inside a block).

Counter CP1 is connected to decoder DE1 (FIG. 2) and amplifier A1 of each associated memory module through wires 11, 12, respectively, on which the part of the address relating to the integrated circuit and to the block of registers is present.

Counter CP2 is connected to an input of a comparator CM2 (FIG. 5) through wires 18 on which the sequential part of the address is present.

Comparator CM2 has a second input connected to line 3 through which it receives the sequential part of the address generated by the time base BT (FIGS. 3 and 4).

Wires 18 and the wires of line 3 are so connected to the inputs of comparator CM2 as to optimize the access time to the memory taking into account the speed of the controller, as explained later.

In case of equality of the addresses, comparator CM2 generates the comparison signal that through connection 4 is sent to both the time base BT and one input of a two-input AND gate P1.

The other input of gate P1 is connected to the output of a two-input OR gate P2 which receives from the controller, through wires 201, 202 of connection 20, the signals R, W respectively indicating the request for a reading or writing in the memory. The output of gate P1 is connected through wire 14 to decoder DE1 (FIG. 2), enabling it to operate.

Figure 6:
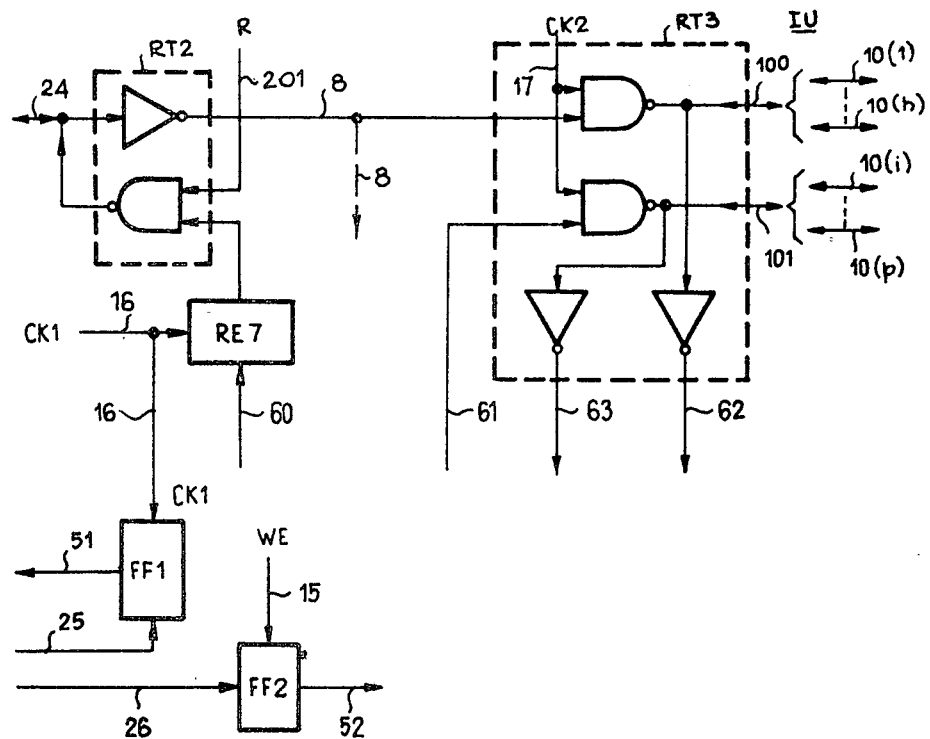
FIG. 6 is a detailed diagram of an input/output unit of the command module.

In FIG. 6, the input/output unit IU of FIG. 3 is shown to comprise a conventional data transceiver RT2 which may be of the "open collector" type. To simplify the drawing, only one logic gate for each direction has been shown, but it is evident that transceiver RT2 includes as many pairs of gates as there are wires in its bidirectional connection 24.

In case of data transfer from the controller to the memory, transceiver RT2 receives from the associated controller C' (FIG. 1) through wires 24 (FIG. 6) the 16 information bits and transfers them via a bus 8 to a second transceiver RT3 and thence to a bus 100 consisting of wires 10(*l*) . . . 10(*h*).

In case of data transfer to the controller, transceiver RT2 sends on wires 24 the information bits, possibly corrected by logic LC (FIG. 3) and received through wires 60 and a register RE7 timed by signal CK1; in the read-modify-write mode, the same corrected bits may also be transferred to transceiver RT3, thus allowing the correction of the memory contents without controller intervention.

The transmission to the controller is enabled when a wire 201 carries a signal indicating that a read phase is in progress.

Transceiver RT3 consists of two units, each comprising—like transceiver RT2—a NAND gate and an inverter. In case of writing in the memory, transceiver RT3 transmits on bus 100 the information bits coming from transceiver RT2 and on bus 101, consisting of wires 10(*i*) . . . 10(*p*), the redundancy bits coming from correction logic LC (FIG. 3) through wires 61 (FIG. 6). The transmission is enabled by signal CK2 present on wire 17.

In case of reading in the memory, transceiver RT3 transfers to correction logic LC (FIG. 3) both the information (wires 62) and redundancy bits (wires 63) so that logic LC may effectuate check and correction operations.

Reference FF1 denotes a conventional flip-flop controlling the "hand shaking" during reading between the memory and the controller, that is the dialogue necessary for the correct transfer of the data read out from the memory.

Whenever flip-flop FF1 receives from the time base through wire 16 a pulse CK1, it emits on a wire 51 to the controller a signal DPR indicating that a datum read in the memory is ready to be transferred to the controller and hence that reading is in progress; the signal is also sent to memory ROM3 (FIG. 4) of time base BT.

Flip-flop FF1 is reset to zero when a signal, confirming the occurred data acceptance, arrives from the controller through a wire 25 (FIG. 6).

Reference FF2 denotes a second flip-flop, identical to component FF1, designed to control the "hand shaking" during writing between the memory and the controller, that is the dialogue necessary for the correct transfer to the memory of the data supplied by the processor.

Whenever flip-flop FF2 receives from controller C' (FIG. 1), through a wire 26, a signal indicating that the datum is valid, i.e. that it must actually be written, it emits on its output 52 a signal DPW indicating that a datum coming from the processor is ready to be transferred to the memory.

Flip-flop FF2 is reset to zero by the trailing edge of write-enable signal WE, coming from the time base through wire 15.

The "datum ready" signal DPW present on wire 52 (which with wire 51 forms connection 5 of FIG. 4) is sent both to the memory ROM3 of the time base and to the controller which thus is informed if the operation is still in progress or is completed.

Figure 7:
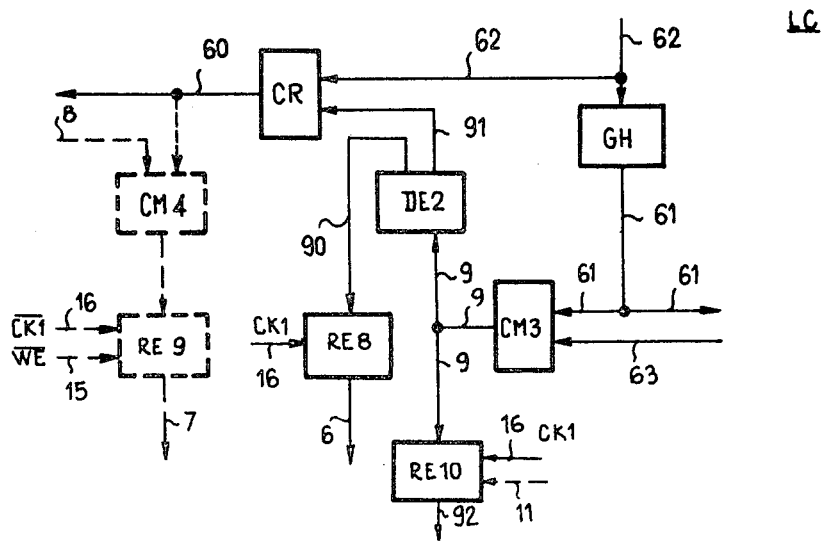
FIG. 7 is a detailed diagram of a corrective logic network included in the command module of FIG. 3.

FIG. 7 represents by way of example the logic LC of FIG. 3 as a network whose operation is based on the Hamming code, using five redundancy bits, which allows the correction of single errors on words with at most 31 bits, including the redundancy bits. The described embodiment uses words with 16 information bits. In the drawing, reference GH denotes a source of such redundancy bits that advantageously consists of a set of 5 parity generators to which the sixteen wires 62 are connected.

Output 61 of bit source GH is connected on the one hand to transceiver RT2 (FIG. 6) and on the other hand to an input of a comparator CM3 consisting for instance of Exclusive-OR circuits; a second input of comparator CM3 is connected to wires 63 conveying the redundancy bits read out from the memory.

An output 9 of comparator CM3 carries five bits that by their logic levels denote whether the bits present on wires 61 and 63 are equal or not. These five bits constitute an error code identifying an incorrect information bit; taking into account that the memory is organized by bits and stores one bit of a word for each module, the error code indicates also the failed module.

Output 9 of comparator CM3 is connected on the one hand to a register RE10, timed by clock pulses CK1, whose output 92 is connected to the controller and conveys the information relating to the failed module.

On the other hand, output 9 is connected to an input of a decoder DE2 which on the basis of the bits of the error code provides on output wires 91 sixteen bits whose logical value indicates the possible error of a corresponding information bit. Wires 91 are connected to an input of a correcting device CR, advantageously consisting of Exclusive-OR circuits, whose second input is connected to wires 62. The output of error corrector CR is composed of wires 60 on which the corrected bits are present.

As the memory is organized by bits, any failure of the module (integrated charge-transfer circuits or addressing unit) gives rise to an error in the sole output bit of the module; therefore, when component CR corrects that bit, it corrects also any error of the module (self-correction with high coverage).

A further output 90 of decoder DE2 carries the information on the presence or absence of errors and is connected to a register RE8 timed by pulses CK1. The output of register RE8 is connected to the controller through a wire 6.

The structure just described is sufficient to detect and to correct the memory errors. For detecting possible malfunctions of logic LC and unit IU (FIG. 3), logic LC can comprise a further comparator CM4 (FIG. 7), having an input connected to the output of circuit CR and another one to bus 8. Device CM4 compares the bits corrected by logic LC with those present on bus 8 after correction. The output of comparator CM4 is connected to a register RE9 activated by the trailing edge of a pulse CK1 (denoted by $\overline{CK1}$) or of writing signal WE (denoted by $\overline{WE}$); the output of register RE9 (wire 7) is connected to the controller.

A further performance of correction logic LC may be obtained by storing in register RE10 not only the error code present on wires 9 and indicating the incorrect bit of a word, but also the address part present on wires 11: this allows the detection of the memory circuit that originated the error and the sending of corresponding information to the controller.

Obviously, by utilizing a greater number of redundancy bits and/or a code different from the Hamming code, multiple errors can be detected and corrected.

The mode of operation of logic LC is as follows.

In a reading phase the information bits coming from a memory on wires 100 (FIG. 6) are sent through wires 62 to bit source GH (FIG. 7) while the redundancy bits present on wires 101 are sent through wires 63 to comparator CM3 which compares them with those present on wires 61. (It is to be noted that in the reading phase the transmitters of transceiver RT3, represented by inverters in FIG. 6, are disabled so that the bits present on wires 61 cannot come back to wires 101.) Possible errors, recognized as discrepancies between the corresponding bits on the two inputs, are indicated by the presence of one or more levels "0" on wires 9.

The signals present on wires 9 are sent to decoder DE2 which, on the basis of the location of the "0" levels in the output configuration of comparator CM3, identifies the information bits found to be incorrect and emits on wires 91 sixteen discriminating bits, each one associated with an information bit. In the presence of an incorrect information bit, the corresponding discriminating bit will have a logical value such as to cause in circuit CR the inversion of the logic level of the incorrect bit and thus its correction.

The corrected bits are then sent to the transmitter of transceiver RT2 (FIG. 6) and thence to the controller. In case of a read-modify-write mode of operation, for which also the transmitters of transceiver RT3 are enabled, the corrected bits fed by circuit RT2 to bus 8 can be transferred to wires 100 and then sent to the memory.

If comparator CM4 (FIG. 7) is being used, the corrected bits present on wire 60 are compared with those arriving at circuit RT2 (FIG. 6) through register RE7 and appearing on bus 8; in this way the proper operation of transceiver RT2 and bus 8 is verified. The result of the comparison is sent, as stated, to the controller.

During writing, the information bits coming from the controller still arrive at source GH (FIG. 7) through circuit RT2 (FIG. 6), bus 8, circuit RT3 and wires 62, and the redundancy bits generated by source GH are sent to the memory via wires 61. As the transmitters of circuit RT2 are disabled, the bits present on wires 60 cannot be transferred to the controller.

If comparator CM4 is in use, the bits on wires 60 can be compared with those actually transmitted by the controller and present on bus 8; any discrepancy will point out possible failures in logic LC; the anomalous situation will be reported to the controller through register RE9.

FIGS. 8a, 8b, 8c, 8d show the waveforms of some timing or conditioning signals in the various modes of operation of the memory, such as refresh, read, write and read-modify-write.

The signals that in a certain operation are always at "0" have not been represented for such operation.

As to the output signals from time base BT, transfer signals $\Phi_3$, $\Phi_4$ have not been represented as they are not essential to the description of the mode of operation.

Shift signal $\Phi_1$ consists of pulses that have the minimum possible duration permitted by the fundamental clock signal (one period of pulses CKO); such a clock pulse always appears at the beginning of the period of signal $\Phi_1$ which, as already noted, defines the time available in the memory for each bit (cycle).

Signal $\Phi_2$ consists of pulses delayed with respect to pulses $\Phi_1$ to an extent dependent on the kind of operation; pulses $\Phi_2$ also have the minimal duration, except in the read-modify-write mode where two operations are necessary for the same memory cell.

As to the other signals emitted by time base BT, signal WE is obviously active only during the operational phases establishing memory writing and consists of pulses with constant duration but variable position; signal CK1 is active during write, read and read-modify-write modes and consists in all these cases of pulses of constant duration and position; signal CK2 is active in the same cases as signal WE and consists of constant-duration pulses overlapping the pulses of signal WE, whatever the position of the latter.

Figure 8A:
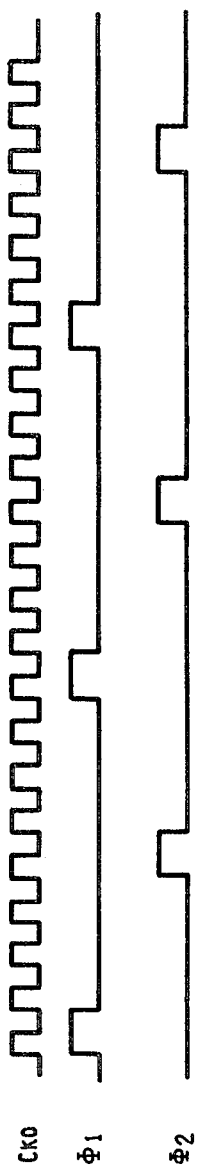
FIGS. 8a–8d are sets of graphs showing waveforms of some signals controlling the operations of the memory under different operating conditions.
Figure 8D:
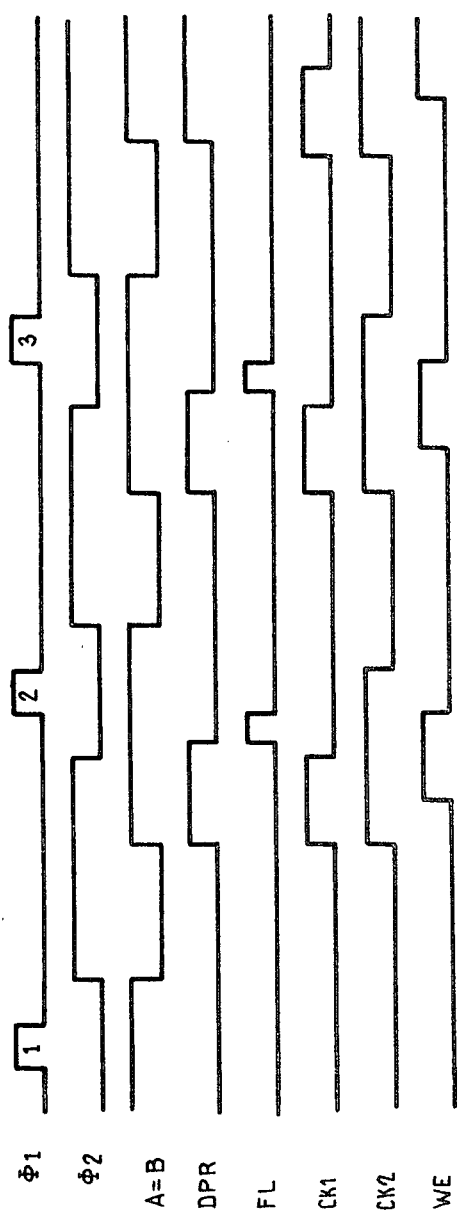
Figure 8B:
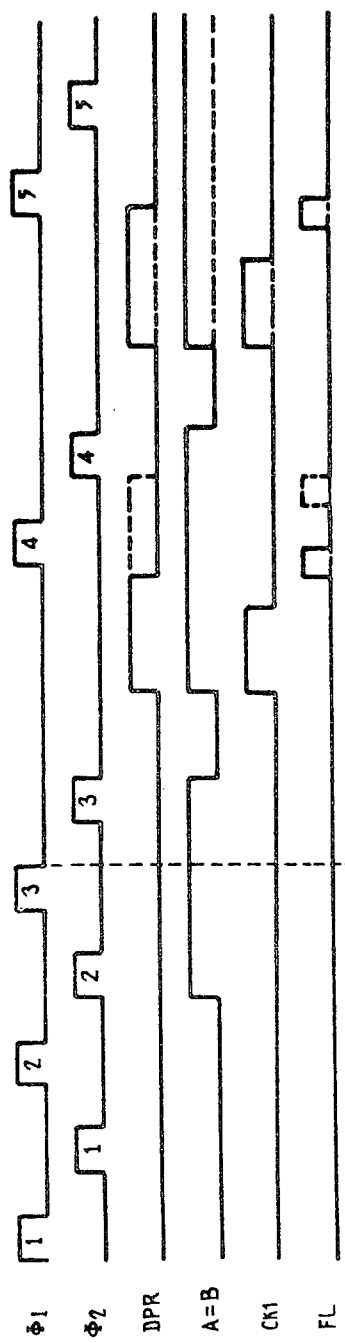
Figure 8C:
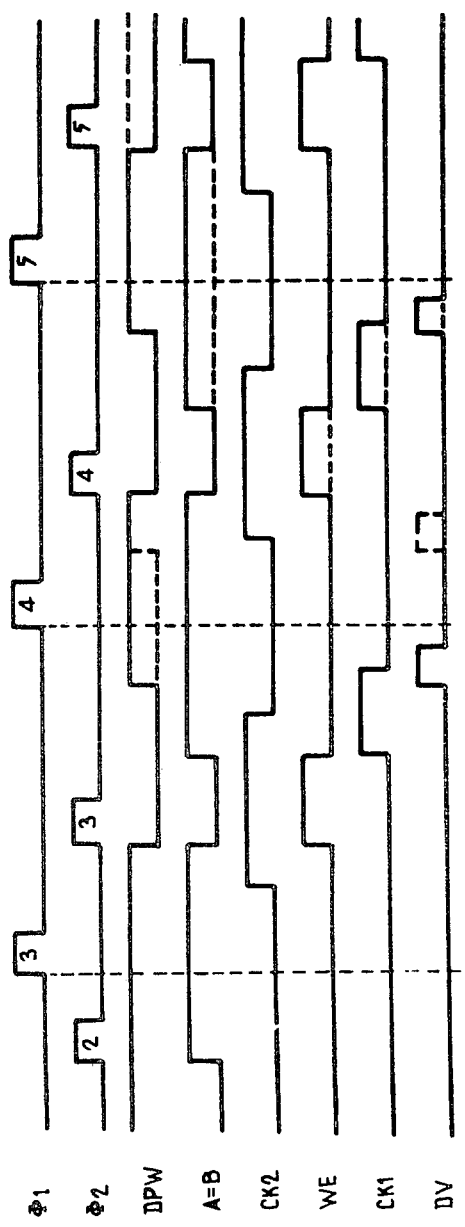

"Datum ready" signals DPR, DPW of FIGS. 8b, 8c and 8d, present on wires 51, 52 (FIG. 6), indicate by passing to "0" the completion of an operation; reference A=B denotes the signal whose logic level "1" characterizes the equality between sequential addresses generated by counters CN0 (FIG. 4) and CP (FIG. 5); reference FL denotes the end-of-reading signal coming from the controller on wire 25 (FIG. 6); reference DV represents a verification signal coming from the controller on wire 26 and indicating that a datum to be written is valid.

It will be noted that clock signal CK0 is represented only in FIG. 8a relating to the refresh mode.

The mode of operation of the device according to the invention will now be described separately for the four types of possible operations, i.e. the information refreshing, reading, writing and read-modify-write modes.

For this description we shall refer to the diagrams of FIGS. 8a–8d supposing, by way of example, that fundamental clock signal CK0 has a period of 100 ns and that shift signals $\Phi_1$, $\Phi_2$ have a period of 400 ns in the case of fast shift and of 800 ns in the case of slow shift.

(1) Refresh mode (FIG. 8a)

This phase is established by the time base when the memory is idle, that is when neither reading nor writing is required by controller C' (FIG. 1).

Under these conditions there is no output signal from gate P1 of device IN (FIG. 5), thus all bit-storing circuits AC (FIG. 2) are disabled by decoder DE1. Besides, also signals WE, CK1, CK2 are at "0" so that transceivers RT1 (FIG. 2) and RT2, RT3 (FIG. 6) are not enabled and no bit loading or unloading is possible in circuits AC.

Hence these circuits receive from the command module MC only the shift and transfer signals which on this occasion have their maximum period.

Under these conditions the bits stored in the registers are recirculated continuously, thus allowing the information to be preserved.

(2) Read mode (FIG. 8b)

A read operation can be considered as encompassing two phases: data search and transfer.

The first phase begins when controller C' (FIG. 1) activates the reading signal (wire 20, FIG. 4) which may deliver to address-control device IN (FIG. 3) the address of the first word involved in the operation and which ends when the time base generates the address where this word is stored; the second phase begins at that instant and terminates when the transfer is over.

Of course there will be no search phase if the initial address signaled by the controller is the one on which the memory is positioned.

The following description refers to the most general case in which the read operation comprises both phases.

Thus, when the controller requests the reading, it can send to counter CP (FIG. 5) both the initial address and a command for storing that address, and to circuits P2 (FIG. 5), ROM2 (FIG. 4) and RT2 (FIG. 6) the indication that a read operation is requested (signal R at "1" on wire 201).

Under this assumption, the address supplied by counter CP (FIG. 5) is different from that of counter CN0 (FIG. 4); the output signal of comparator CM2 (FIG. 5) communicates this situation to memories ROM2 and ROM3 (signal A=B at "0") which put themselves in the search phase and generate signals $\Phi_1$-$\Phi_4$ and CK1 with a period and shape typical of this phase. More particularly, signals $\phi_1$ and $\phi_2$ have their minimum period and signal CK1 is at "0".

These conditions persist until the cyclical counting of circuit CN0 (FIG. 4) generates, as the next stateof memory ROM1, the same address that is emitted by counter CP (FIG. 5). This condition is supposed to coincide with the second pulse $\Phi_2$ in FIG. 8b. At the end of the subsequent pulse $\Phi_1$ (pulse No. 3), memories ROM2, ROM3 find address coincidence (signal A=B at "1", no reading operation in progress (signal DPR at "0") and a reading request: consequently, they position themselves in a state corresponding to the actual read phase, i.e. with signals $\Phi_1$, $\Phi_2$ changing their maximum period and emission of a pulse CK1.

As the reading signal is always present on wire 201, the transmitter of circuit RT2 (FIG. 6) and the gate P1 (FIG. 5) are enabled to let through the signals present at their inputs while the transmitters of circuit RT1 (FIG. 2) are enabled as signal CK2 is at "0".

Furthermore, the passage to "1" of signal A=B present on wire 14 (FIGS. 2, 5) enables the circuits DE1 of all memory modules to decode the address bits present on wire 11 and thus to activate one of the 32 circuits AC, e.g. circuit AC1, in all modules ME.

On the subsequent passage to "1" of signal $\Phi_2$ (pulse No. 3) the output registers of corresponding blocks of circuits AC1 of all the memory modules emit the bit stored in their last cell.

In each module, the bit read in circuit AC1 is sent through wire 10b to the tranmitter of circuit RT1 for passage over the respective wire 10; the bits present on all wires 10 of the memory units represent the word read in the memory and are sent to the command module MC.

In particular, the bits read in the memory are transferred to correction logic LC (FIGS. 3, 7) for checking and possible correction.

Corrected bits and error signaling, present on wires 60 and on wire 90, respectively, arrive at the input of registers RE7 (FIG. 6) and RE8 (FIG. 7) and, as soon as signal CK1 passes to value "1", appear on wires 24 and 6, respectively. Meanwhile, at the end of pulse No. 3 of signal $\Phi_2$, counter CN0 (FIG. 4) is advanced by one step, thus emitting an address different from that of counter CP (FIG. 5).

When signal CK1 passes to "1", counter CP (FIG. 5) also advances by one step so that the addresses are equal again (supposing the comparison occurs between bits of the same weight); besides, signal DPR passes to "1" and remains there till the end-of-reading signal FL arrives at flip-flop FF1 (FIG. 6).

If such a signal arrives before the end of the subsequent pulse (No. 4) of signal $\Phi_1$, that is if the controller has stored the data within the 400 ns elapsed between the passage to "1" of signal CK1 and the passage to "0" of signal $\Phi_1$, the situation present at the end of pulse No. 3 recurs and thus the operations are repeated as in the previous cycle for the next word to be read.

Then this procedure goes on unchanged till the controller terminates the read command either because the whole block of words has been read or because counter CP (FIG. 5) has signaled the end of its counting capacity. At that point the system returns to the conditions already described for the mode "refresh".

In case controller C' was unable to store the first word within the predicted time, signal FL has not yet arrived at the end of pulse No. 4 of signal $\Phi_1$ so that signal DPR is still at "1", as denoted by the broken line in FIG. 8b. In this situation the emission of pulse CK1 is blocked; thus on the arrival of pulse No. 4 of signal $\Phi_2$, when the time base advanced again by one step, an address discrepancy between counters CN0 (FIG. 4) and CP (FIG. 5) will occur. The time base re-enters the search phase till the address identity is again established.

The passage to a search phase can occur either when the end-of-reading signal arrives or as soon as the address discrepancy is found. It is evident that in case of very slow control systems requiring several periods of signal $\Phi_1$ to store a word, the second alternative can allow the operations to be sped up.

It has to be remembered that, owing to the structure of the memory, the period of signal $\Phi_1$ cannot be lengthened beyond a certain limit, wherefore it may happen that the control system is unable to store the data within the available time.

It is clear, however, that the data do not get lost in such a case because a new operation cannot begin if the previous one is not completed (signal CK1 is at "0" if signal DPR is high before the end of the pulse $\Phi_1$).

Under the conditions described above (with the controller unable to accept the data within a period of signal $\Phi_1$) the next address equality can occur only after a time depending on the way the inputs of comparator CM2 (FIG. 5) have been connected to wires 3 and 18. If the connection is such that the bits of equal weight are compared in the two addresses, reading will be possible only after the time base has scanned again the addresses of the 4096 cells of a block. If, on the contrary, the wires are connected so as to compare the bits of different weight in the two addresses, a more frequent reading is possible. For instance, if the controller requires a reading time ranging between 1 and 2 cycles, the least-significant bit of the time base can be compared with the most-significant one of the word counter CP; the second bit of the time base can be compared with the least-significant one of the word counter, the third bit of the time base can be compared with the second bit of the counter and so on; in this way there is address equality every two cycles with resulting optimization of transfer speed. Analogous procedures can be followed in cases where the controller requires for instance 4, 8 . . . cycles for reading; then it will be enough to shift the wires by two, three . . . positions.

(3) Write mode (FIG. 8c)

The write operations are basically carried out by following the procedures adopted for read operations, that is when the write command arrives from controller C' (FIG. 1), the search of the first address begins and is followed by the actual data transfer. The search phase is identical to that of the read phase, with the only exception that the enabling signal for gate P1 (FIG. 5) of device IN arrives through wire 202 and not wire 201. When the addresses have been found equal (for instance again during the second cycle of signal $\Phi_1$), at the end of the subsequent pulse $\Phi_1$ the signal DPW is at "1" (supposing the controller has furnished the first character to be written at the moment of the writing request), signal A=B is at "1" and obviously the signal of writing request (not shown) is also at "1". Under these conditions, memories ROM2 and ROM3 dispose themselves in the writing state wherein, as stated, signals WE and CK2 will be active and the pulse $\Phi_2$ is slightly more delayed with respect to pulse $\Phi_1$ than was the case during reading (for instance 200 ns instead of 100) in order to allow a better correlation of the operation with the cycle.

On the passage of signal CK2 to "1", transceiver RT3 (FIG. 6) is enabled to let through the bits present on bus 8 and to transfer them on wires 100 to transceivers RT1 (FIG. 2) of the memory modules ME1 . . . MEh; in each module, the arriving bit appears on wire 10a. From bus 100 (FIG. 6) the information bits are transferred also through wires 62 to the correction logic LC which generates redundancy bits and transmits them to transceiver RT3 that, in turn, presents them on bus 101 (FIG. 6) and sends them to memory modules ME1 . . . MEp. The next passage to "1" of signals WE and $\Phi_2$ activates in each memory module the input registers of the circuit AC (FIG. 2) enabled by decoder DE1 to store actually the bit arriving on wire 10a and in addition advances counter CNO (FIG. 4) by one step.

On the passage of signal WE to "1", signal DPW goes to "0" so that the controller may be ready for the subsequent operation. In addition, if logic LC (FIG. 3) comprises comparator CM4 (FIG. 7) and register RE9, the possible presence of malfunctions in the transceivers and in the bus of unit IU or in the logic itself is signaled to the controller.

On the passage of signal WE to "0", signal CK1 passes to "1", thus advancing by one step the counter CP (FIG. 5): address equality is again reached. If, before the end of the cycle, the new signal of valid datum DV arrives from the controller and restores "ready" signal DPW to its high level, the conditions necessary for writing are again reached; writing will take place during the subsequent cycle according to the same procedure.

If the signal DV does not arrive before the beginning of the cycle during which the write operation is to be carried out (e.g. before the beginning of the cycle identified by pulse No. 4 of signal $\Phi_1$), the arrival of such a pulse would find signal DPW at "0". Under these conditions (denoted by a broken line in FIG. 8c), signal WE remains at "0" so that the operation is not carried out; as a consequence, signal CK1 remains at "0", counter CP (FIG. 5) is not advanced, and in the subsequent cycle the addresses generated by counters CNO (FIG. 4) and CP (FIG. 5)—supposing the comparison occurs between bits of equal weight—will not be equal, thus again inhibiting the operations. Also in this case, the above-mentioned considerations relating to read operations for connecting the wires of lines 3 and 18 (FIG. 5) with the inputs of comparator CM2 remain valid.

Obviously, if signal DV does not arrive even after a delay, the memory enters the refresh state. Such situation is not represented in FIG. 8c.

(4) Read-modify-write mode (FIG. 8d)

This type of operation allows the rewriting in the memory of the data corrected in logic LC; the corresponding information is supplied to the time base by the simultaneous presence of signals R, W.

In this type of operation, signals $\Phi_1$, $\Phi_2$ are at their maximum period; signal $\Phi_2$ passes to "1" as for reading but remains at "1" till about the end of the cycle (for instance 100 ns before the end). In this way the memory is preset to carry out two operations for the same cell. Signal CK1 has the same behavior as in the read and write modes.

Signal WE passes to "1" shortly after signal CK1 (for instance after 100 ns) and remains high till the end of the cycle. Signal CK2 will be superimposed on signal WE as for writing and passes to "1", with signal CK1 coming back to "0" at the end of the pulse $\Phi_1$ of the subsequent cycle.

In this kind of operation, while signal $\Phi_2$ is at "1", both signals CK1 and WE (and thus also CK2) are high for a certain time; consequently the data can be transferred to both the controller and the memory; more particularly, the corrected data supplied by the correction logic LC through wires 60 are presented by register RE7 both on wires 24 and on bus 8 (as in the read mode) and in addition can pass from this bus onto wires 100 and 62 (as in the write mode) and can be sent both to modules ME and to the correction logic LC in order to generate redundancy bits.

In this type of operation, the dialogue on the controller side is determined only by the ready-datum signal DPR for reading and by the end-of-reading signal FL, whereas signals DPW and DV are disregarded and hence not represented.

Obviously the considerations pertaining to reading and writing are also applicable to this case if the controller is slow with respect to the memory.

The embodiment described with reference to FIGS. 1 to 7 relates to the case of words containing, besides the information bits, only the minimum number of redundancy bits necessary for self-correction. Nevertheless, the bit organization of the memory allows a certain flexibility in the number of both information and redundancy bits.

A variation in the number h of information bits involves only a change in the number of memory modules ME (FIG. 1) provided for these bits and in the number of wires of connection 100 (FIG. 6). This happens where the number of information bits added to the number of redundancy bits is lower than the number of bits checkable by the established redundancy bits (in our case, five redundancy bits can control 31 bits, hence the number of information bits can increase up to 26 without involving an increase in the number of redundancy bits). Obviously, the number of information bits can exceed this limit if there is also an increase in the number of redundancy bits and related memory modules.

A variation in the number (p-h) of redundancy bits (which can also be carried out independently of any increase in information bits) will involve a variation in the number of the related memory modules ME (FIG. 1) and in the number of wires of connection 101 (FIG. 6), along with variations inside blocks GH, CM3, DE2 (FIG. 7) of correction logic LC.

In particular, if the Hamming code is always used for the correction, the words to be stored can contain 16 information bits and 6 redundancy bits: this allows the detection also of double errors.

A further possibility offered by the organization by bits resides in providing, besides modules ME($i$) . . . ME($p$) designed to store the redundancy bits necessary for the self-correction, one or more modules serving as spares for purposes of reliability, i.e. standby modules designed to replace one or more faulty modules through a reconfiguration. This reconfiguration involves also a new initialization of the memory, i.e. the writing in the spare module of the data contained in the replaced module.

Figure 9:
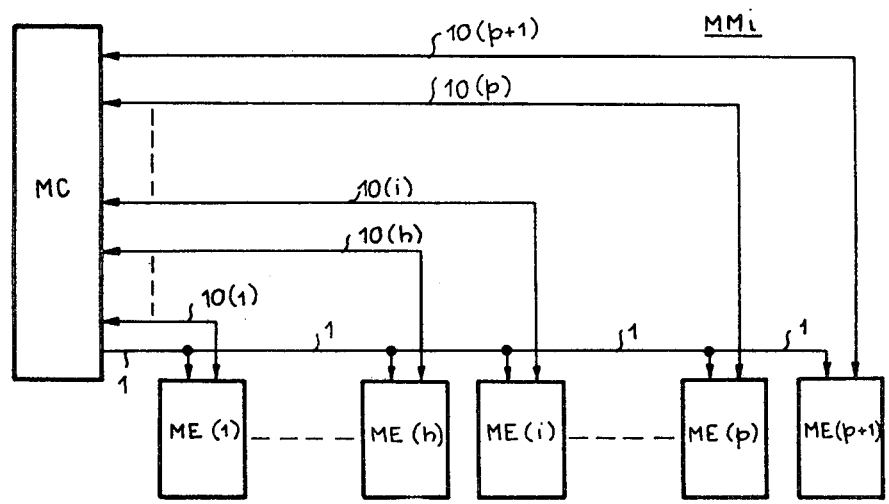
FIG. 9 is a diagram of a memory unit expanded with reference to that of FIG. 1.
Figure 10:
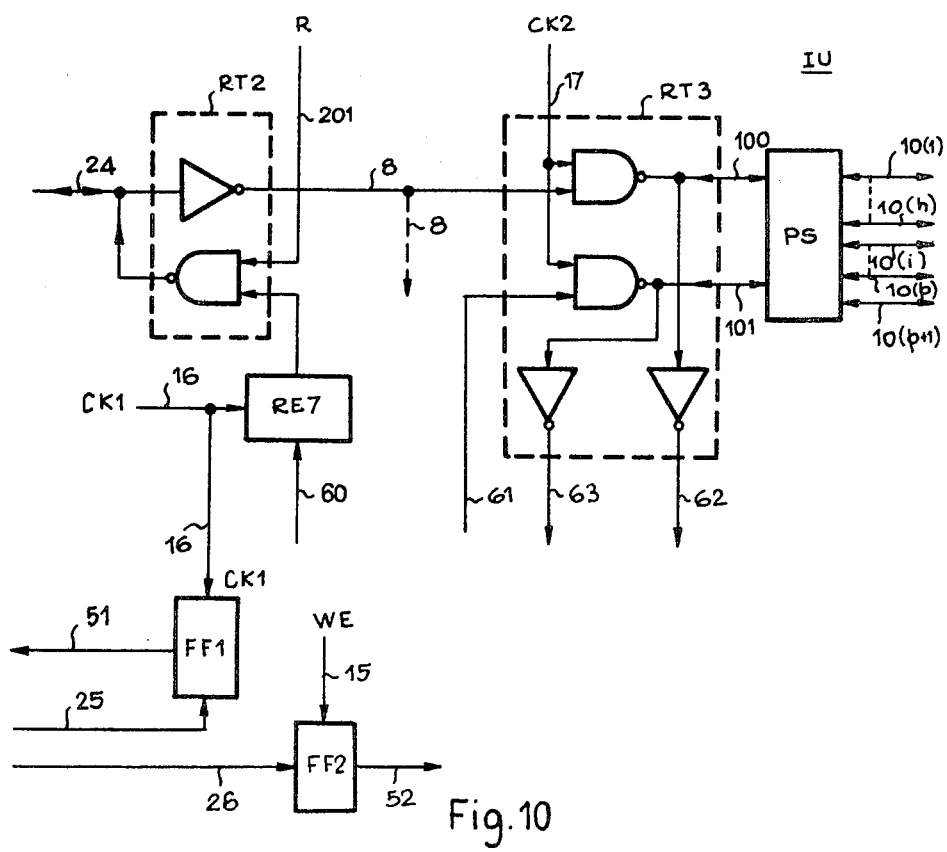
FIG. 10 is a diagram of an input/output unit of a command module of the unit shown in FIG. 9.
Figure 11:
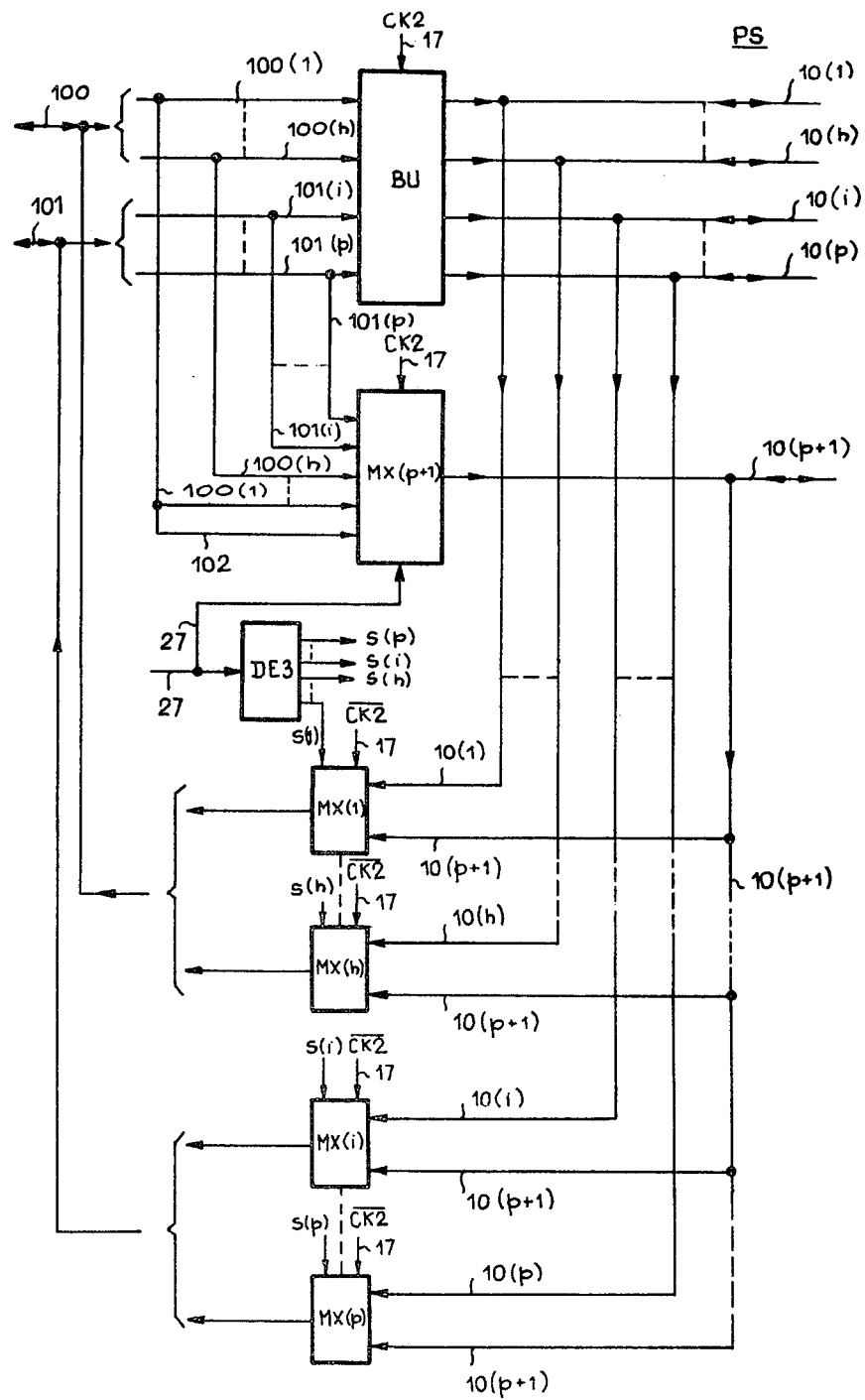
FIG. 11 is a block diagram of a switching circuit of the input/output unit of FIG. 10.

Such an embodiment, described with reference to FIGS. 9 to 11, presents great reliability advantages and allows the restoration of the memory system without service interruptions.

FIG. 9 shows a memory unit MMi' comprising, as in the case of FIG. 1, a command module MC' and memory modules ME($l$) . . . ME($h$) for information bits and ME($i$) . . . ME($p$) for self-correction bits, along with a module ME(p+1) serving as a spare for one of modules ME(l) . . . ME(p).

The addition of module ME(p+1) requires that module MC', and in particular its input/output unit IU' (FIG. 10), should also contain so-called "switching points", i.e. rerouting circuits that in the case of a malfunctioning memory module allow the sending of the bits intended for the damaged module to the spare module and direct to the controller the bits coming from the spare module instead of those originating at the faulty module.

These switching points are designated PS in FIG. 10 and are connected on the one hand to wires 100, 101, already described with reference to FIG. 6, and on the other hand to the memory modules through wires 10($l$) . . . 10($h$), 10($i$) . . . 10($p$), 10(p+1).

An embodiment of circuit PS is shown in FIG. 11 In this Figure, references MX($l$) . . . MX($h$), MX($i$) . . . MX($p$), MX(p+1) denote conventional multiplexers with tri-state output; reference BU designates a set of tri-state or open-collector buffers, enabled by signal CK2, connected on one side to wires 100, 101 and on the other side to wires 10 and carrying out functions similar to those of transceivers RT2, RT3 (FIG. 10).

The term "tri-state" means, as known in the art, that, besides the two usual logic levels, a third state with high-impedance output is possible. This allows the use of bidirectional transmission lines for the connection between the command module and the memory modules.

Each multiplexer MX($l$) . . . MX($p$) has two inputs and an output: the first input of each multiplexer is connected to the memory module with the same postscript through a respective wire 10, whereas the second input of each multiplexer is connected to spare module ME(p+1) through wire 10 (p+1).

Multiplexers MX($l$) . . . MX($p$), which are enabled during memory reading (absence of signal CK2), are normally set on their first inputs.

A possible switching to the second input, in case of failure or under certain conditions described hereinafter, is commanded by respective select signals s($l$) . . . s($h$), s($i$) . . . s($p$) coming from a decoder DE3 receiving and decoding a bit configuration that is sent by the controller through a connection 27 and indicates which memory module should be replaced by the spare module. Therefore, this bit configuration acts as a switching command.

Multiplexer MX(p+1) has an output connected to spare module ME(p+1) through wire 10(p+1) and p inputs connected to wires 100($l$) . . . 10($h$), 101($i$) . . . 101($p$), respectively. Device MX(p+1) is provided with an additional input connected to a wire 102 which advantageously is constantly connected in parallel with one of the other p inputs, e.g. with input 100(l) connected to output 10(p+1) under normal operational conditions of the memory.

If data of module ME(l) are stored in module ME(p+1) from the beginning of memory operation, this embodiment allows that correction logic LC of command module MC' controls also the spare module ME(p+1), as described below.

Multiplexer MX(p+1) is enabled during write modes by signal CK2; the switching among its different inputs is controlled by the bit pattern present on connection 27.

The diagram of FIG. 11 concerns the case of only one reliability spare module ME(p+1). If several spare modules are required, some variations in the structure of circuit PS are necessary, namely:

each spare module is connected both to a multiplexer similar to circuit MX(p+1) and to an additional input of multiplexers MX($l$) . . . MX($p$);

the bit pattern conveyed by the controller on connection 27 must indicate the identity of the damaged module or modules as well as the necessary reconfiguration instructions.

In that case, decoder DE3 can be replaced by a read-only memory addressed by that bit pattern.

In the particular case of only two spare modules, two decoders, similar to component DE3 and each connected to one of the spare modules, can be sufficient.

The operation of the embodiment of our invention shown in FIGS. 9 to 11 is substantially similar to that of the embodiment of FIGS. 1 to 7, as long as a reconfiguration is not required.

The only variation consists in the fact that during read modes (absence of signal CK2) the data read in the memory reach transceiver RT3 (FIG. 10) through multiplexers MX($l$) ... MX($p$) (FIG. 11) set on their first inputs, while during write modes the data outgoing from transceiver RT2 (FIG. 10) are sent to the memory through buffer BU (FIG. 11): furthermore, if multiplexer MX(p+1) is provided with a "rest" input 102, the data concerning for example module ME(l) are written also in spare module ME(p+1). As to reconfiguration, a distinction is necessary between an actual reconfiguration, caused by a memory error, and a fictitious reconfiguration, requested by the controller only for the purpose of monitoring the correct operation of the spare module.

In the latter instance, the reconfiguration is allowed by both the presence of the (p+1)$^{th}$ input of multiplexer MX(p+1) and its constant connection to branch 102 of wire 100(l).

This fictitious reconfiguration implies that the controller conveys on connection 27 a bit configuration commanding the switching of multiplexer MX(p+1) from its input lead 102 to lead 100(l); furthermore, this bit configuration is decoded by device DE3 which emits signal s(l) and commands the switching of multiplexer MX(l) onto its input connected to memory module ME(p+1).

The reconfiguration is only fictitious because, as already said, modules ME(l) and ME(p+1) contain the same data.

Nevertheless, during the read mode, data are taken from module ME(p+1) rather than from module ME(l) and are checked and possibly corrected by logic LC (FIG. 7), as already described with reference to the embodiment shown in FIGS. 1 to 7. Obviously, no variations occur in the writing modes.

In case of actual failure, the identity of the faulty module is sent to the controller by logic LC (FIG. 7) through register RE10 and wire 92. On the basis of this information, the controller sends on connection 27 (FIG. 11) the switching order.

If the failure occurs in module ME(l), the situation already described for the fictitious reconfiguration occurs.

On the other hand, if the failure occurs in a module different from ME(l), for instance module ME(h), decoder DE3 emits signal s(h) and causes the switching of multiplexer MX(h) from its first to its second input.

As spare module ME(p+1) does not contain the same data as the defective module ME(h), the system should be initialized again, i.e. the memory should be reloaded so that module ME(p+1) contains the requisite data.

From now on, the operations are repeated in an unchanged way. The re-initialization can be avoided in some particular cases when, for example, the memory is cyclically loaded; the data read out of the spare module are then automatically corrected by logic LC (FIG. 7) and rewritten in module ME(p+1) within a memory cycle.

This procedure presents a disadvantage since, if logic LC allows only the correction of one error at a time, all its correction capacity would be engaged for the reconstruction of the correct data as long as the spare module is not reloaded; if an error occurs in another module, the correction logic could not intervene and the system would be out of order.

FIG. 12 shows a possible embodiment of a fully redundant memory unit MMi" comprising not only spare memory modules but also several control modules.

The full redundancy enhances the reliability of the performance of the mass memory, as also the errors of the control modules can be corrected.

Memory unit MMi", shown in FIG. 12, includes three command modules MCA, MCB, MCC and a multiplicity of x memory modules ME'($l$)-ME'(1). A certain number p of these memory modules are designed, as in FIG. 1, to store both information bits and redundancy bits necessary for self-correction; the remaining x-p modules are spare modules. Command modules MCA, MCB, MCC each contain a time base BT, an address-control device IN, a correction logic LC and an input-/output unit IU' (equipped with switching points), as in the embodiment of FIGS. 9-11 using a single command module; furthermore, each module MCA-MCC comprises a respective synchronization logic LSA, LSB, LSC connected to the time base BT of the same control module and to the synchronization logics of the other modules in order to synchronize the three time bases.

The triplication of a time base for reliability purposes is known to persons skilled in the art; an example is described in commonly owned U.S. Pat. No. 4,096,396.

The three command modules are connected to the controller through the respective bidirectional lines (or pairs of unidirectional lines) 2A, 2B, 2C and to all the memory modules through wires 10(1)A ... 10(x)A, 11A, 12A, 13A, 14A, 15A, 10(1)B to 15B and 10(1)C to 15C corresponding to connections 10 to 15 described with reference to the previous embodiments.

For the sake of simplicity, wires 2, 10 to 15 are shown connected generally to blocks MCA-MCC and not to their internal devices from which they actually extend.

FIG. 12 shows also, for memory module ME'(1), the modifications made necessary by the triplication of the command module. In particular, the five terns of connections 11(A,B,C), 12(A,B,C), 13(A,B,C), 14(A,B,C), 15(A,B,C) reach as many sections of a majority logic LM1; each section emits a signal similar to that present on at least two inputs. Outputs 11, 12, 13, 14, 15 of logic LM1 are the inputs of a circuit arrangement corresponding to that of module ME shown in FIG. 2.

Wires 10(1)A, 10(1)B, 10(1)C are connected to three transceivers RT1A, RT1B, RT1C (equal to transceiver RT1 of FIG. 2); they send the signals to be written into the memory to the three inputs of a second majority logic LM2, which emits the signal present on at least two inputs; output 10a of logic LM2 corresponds exactly to output 10a of transceiver RT1 of FIG. 2.

The data read in the memory and present on wire 10b are sent, at the same time, to the three transceivers RT1A, RT1B and RT1C and from there to the respective control modules MCA, MCB, MCC.

The description of memory module ME'(l) applies, obviously, also to all the other memory modules: each module comprises a first majority logic, with inputs connected to the five terns of connections 11(A,B,C) to 15(A,B,C), three transceivers which have inputs connected to the three wires 10 relating to that module, and a second logic downstream the three transceivers.

Various modifications may be introduced in the realization of the circuitry herein described within the scope of our present invention.

In particular, we have referred to bidirectional transmission lines for the signals read out from or to be written in the memory. If different lines are used for the two transmission directions, transceivers RT2, RT3 of input/output units IU or IU' (FIGS. 6 and 10) would be no longer necessary; furthermore, in the case of the unit UI' shown in FIG. 10, switching point PS would no longer require the presence of buffer BU (FIG. 11) and the use of tri-state components.

The simplification of the input/output unit allowed by the use of unidirectional transmission lines would be balanced by the impossibility of controlling the operation of unit IU through circuits CM4 and RE9 of FIG. 7 which functions by virtue of the coupling between the two transmission directions afforded by transceivers RT2 and RT3 (FIGS. 6, 10). Therefore, the technician should evaluate each time the greater utility of uni- or bidirectional lines.

Whereas FIG. 12 shows an embodiment with triplicated command module, which is self-corrective also for the control equipment, it would also be possible to use, for instance, only a duplicated command module; such a modification, however, may require supervision of the reconfiguration by additional equipment and may thus involve other complex circuits.

If the added equipment does not detect failures, the two command modules should detect their own malfunctions which would call for further duplication of each block to facilitate rapid self-diagnosis with sufficient coverage.

We claim:

1. In a telecommunication system wherein a processor exchanges data through a controller with a mass memory, the improvement wherein said mass memory comprises:

a plurality of solid-state memory modules including a first group of memory modules for the storage of a multiplicity of information words, a second group of memory modules for the storage of as many redundancy words respectively associated with said information words, and at least one spare module, the number of modules of said first group equaling the number of bits in each information word, the number of modules of said second group equaling the number of bits in each redundancy word, each of said memory modules including a multiplicity of integrated charge-transfer circuits for the continuous recirculation of respective bits, each of said charge-transfer circuits consisting of several randomly accessible blocks of series-parallel-series registers responsive to shift and transfer signals; and a command module responsive to signals from said controller for writing and reading respective bits of an information word and of an associated redundancy word at corresponding locations of selected charge-transfer circuits of all memory modules of said first and second groups, said command module including a time base emitting said shift and transfer signals, an address generator identifying said locations, and corrective logical circuitry communicating with said memory modules through an input/output unit for verifying the accuracy of bits written and read, said input/output unit comprising switching means responsive to an instruction from said controller for loading said spare module with the contents of a defective memory module of either of said groups and substituting the spare module so loaded for the defective module in subsequent reading and writing operations.

2. A telecommunication system as defined in claim 1 wherein said input/output unit includes transceiver means with input and output leads extending to said logical circuitry and with transmitting sections for information and redundancy bits blockable and unblockable by signals from said command module, said logical circuitry including comparison means connected to said input and output leads for detecting deviations between bits entering and leaving said transceiver means.

3. A telecommunication system as defined in claim 1 or 2 wherein said switching means includes a multiplexer with inputs connected to lines for the transmission of bits from said command modules to respective memory modules of said first and second groups and with an output connected to said spare module, said multiplexer normally connecting one of said inputs to said output for feeding bits concurrently to said spare module and to one of the other memory modules.

4. A telecommunication system as defined in claim 3 wherein said lines include respective buffer circuits, the inputs of said multiplexer being connected to said lines at junctions upstream of said buffer circuits.

5. A telecommunication system as defined in claim 1 or 2 wherein said command module is one of three identical command modules connected in parallel between said controller and said memory modules, each of said memory modules including circuit means for decoding signals from said command modules by majority logic.

* * * * *